United States Patent
Yamazaki et al.

(10) Patent No.: US 7,456,040 B2
(45) Date of Patent: Nov. 25, 2008

(54) METHOD FOR PRODUCING SEMICONDUCTOR OPTICAL DEVICE

(75) Inventors: Kouichiro Yamazaki, Yokohama (JP); Kenji Hiratsuka, Yokohama (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 11/636,710

(22) Filed: Dec. 11, 2006

(65) Prior Publication Data

US 2007/0155031 A1    Jul. 5, 2007

(30) Foreign Application Priority Data

Dec. 14, 2005    (JP)    ............... 2005-360736

(51) Int. Cl.
*H01L 21/00*    (2006.01)
(52) U.S. Cl. ............... 438/41; 438/40; 257/623; 257/627; 257/628
(58) Field of Classification Search ............... 438/39, 438/40, 41
See application file for complete search history.

(56) References Cited

U.S. PATENT DOCUMENTS

| | | | | |
|---|---|---|---|---|
| 4,542,511 A | * | 9/1985 | Goodfellow et al. | 372/43.01 |
| 4,701,927 A | * | 10/1987 | Naka et al. | 372/46.01 |
| 4,852,110 A | * | 7/1989 | Fujii et al. | 372/44.01 |
| 4,852,111 A | * | 7/1989 | Hayakawa et al. | 372/45.01 |
| 4,864,581 A | * | 9/1989 | Nelson et al. | 438/758 |
| 5,093,278 A | | 3/1992 | Kamei | |
| 5,227,015 A | * | 7/1993 | Fujihara et al. | 438/40 |
| 5,311,534 A | * | 5/1994 | Mori et al. | 372/46.01 |
| 5,379,314 A | * | 1/1995 | Nemoto et al. | 372/46.01 |
| 5,661,075 A | * | 8/1997 | Grodzinski et al. | 438/32 |
| 5,665,612 A | * | 9/1997 | Lee et al. | 438/40 |
| 6,110,756 A | * | 8/2000 | Otsuka et al. | 438/41 |

FOREIGN PATENT DOCUMENTS

JP    10-242563    9/1998

* cited by examiner

*Primary Examiner*—David Vu
*Assistant Examiner*—Earl N Taylor
(74) *Attorney, Agent, or Firm*—Smith, Gambrell & Russell, LLP (57) ABSTRACT

The present invention is to provide a method for manufacturing a semiconductor optical device, in which the unevenness of the burying of the mesa structure may be reduced. The process is configured to form a mask extending along [011] direction on the cap layer, to form a mesa structure by etching the upper cladding layer made of InP, the active region, and the lower cladding layer, to form a surfaces with the (01-1) and the (0-11) planes on both sides of the mesa structure, respectively, by causing the mass transportation, and finally to form the blocking layer by using the mask formed in advance. A semiconductor region with the second conduction type, which is the same with that of the upper cladding layer and is different from that of the lower cladding layer, is grown on the upper cladding layer after removing the mask and the cap layer.

11 Claims, 7 Drawing Sheets

METHOD FOR PRODUCING SEMICONDUCTOR OPTICAL DEVICE

BACKGROUND OF THE INVENTION

1. Field of the Invention

The present invention relates to a method for producing a semiconductor optical device.

2. Related Prior Art

A Japanese patent application published as JP-H10-242563A has disclosed a method for manufacturing a semiconductor optical device that includes a semiconductor layer containing aluminum (Al), a mesa structure extending along a [011] orientation, a cladding layer covering sides of the mesa structure and formed by the mass transportation, and a semiconductor layer covering the sides of the mesa and burying the mesa structure. The method disclosed therein provides a first step for forming the mesa structure, a second step for carrying out the mass transportation until the side of the cladding layer appears a surface with the {111} planes, and a third step for forming a semiconductor layer to bury the mesa structure.

An United States patent U.S. Pat No. 5,093,278 has disclosed a method for producing a semiconductor optical device having a buried mesa structure, which includes a first step of sequentially growing a first cladding layer, an active layer, a second cladding layer and a cap layer, a second step for forming a mask with a striped plane shape, a third step for etching, by using the mask thus formed, the cap layer with an etchant first and the other semiconductor layers with another etchant until a portion of the semiconductor substrate exposes, and a fourth step for selectively forming a blocking layer in both sides of the waveguide region etched in advance.

Those semiconductor optical devices appeared in the patens mentioned above have the structure for burying the mesa structure. This configuration to bury the mesa structure enhances a performance of the device. However, the buried structure strongly depends on the cleanness of the surface on which the burying layer is grown and/or the cross section of the mesa structure.

The method disclosed in the Japanese patent application published as JP-H10-242563A is hard to realize a stable surface with the {111} planes on both sides of the mesa structure with the normal trapezoidal cross section. Thus, a simplified method has been desired. The present invention is to provide a method for manufacturing a semiconductor optical device, where the unevenness of the burying of the mesa structure can be reduced.

SUMMARY OF THE INVENTION

Accordingly, the present invention is to provide a method for manufacturing an optical semiconductor device that enhances a quality of the burying region in both sides of the mesa structure.

The method according to the present invention comprises; (A) sequentially growing, on a surface with a (100) plane of a semiconductor substrate of a first III-V compound semiconductor material with a first conduction type, a lower cladding layer of a second III-V compound semiconductor material with the first conduction type, an active region, an upper cladding layer of a third III-V compound semiconductor material with a second conduction type, and a cap layer of a fourth compound semiconductor material, (B) forming a mask extending along a [011] orientation, (C) etching the cap layer selectively with respect to the other semiconductor layers and the substrate to form both sides of the cap layer with (−11-1) and (−1-11) planes, respectively, (D) etching the semiconductor layers stacked below the cap layer selectively to the cap layer until exposing the semiconductor substrate to form the mesa structure by causing a mass transportation, (E) thermally treating the mesa structure at a first temperature within a atmosphere containing group V elements to form both sides with (01-1) and (0-11) planes, respectively, in the upper cladding layer, and (F) burying the mesa structure by growing a burying region with the second conduction type on both sides of the mesa structure at a second temperature successively to the thermal treatment.

In the present invention, the upper cladding layer may include an InP which accelerates the formation of sides with the (01-1) and the (0-11) planes by the mass transportation. The first temperature may be higher than the second temperature not to degrade the sides with the (01-1) and the (0-11) planes in the upper cladding layer during the successive growing of the burying region and the atmosphere within which the thermal treatment is performed may include phosphorous or arsenic.

According to the method of the present invention, even the mesa structure extends along the [011] orientation and both sides of the mesa appear surfaces with (11-1) and (1-11), respectively, in the lower cladding layer and the active region, while, surfaces with crystal planes varying from (−11-1) to (11-1) and (−1-11) to (1-11), respectively, in the upper cladding layer, both sides of the upper cladding layer provides the surfaces with the (01-1) and the (0-11) planes prior to the subsequent growth of the burying region by the thermal treatment. The surfaces with the (01-1) and the (0-11) planes become clean and thermally stable; accordingly, the quality of the burying region and the homogeneity thereof may be enhanced.

DESCRIPTION OF PREFERRED EMBODIMENTS

The present invention will be understood by the description hereinbelow as referring to accompanying drawings. Next, embodiments relating to a method for manufacturing semiconductor optical devices according to the present invention will be described as referring to drawings. In the description, same elements will be referred by the same symbols or numerals without overlapping explanations.

Figure 1A:
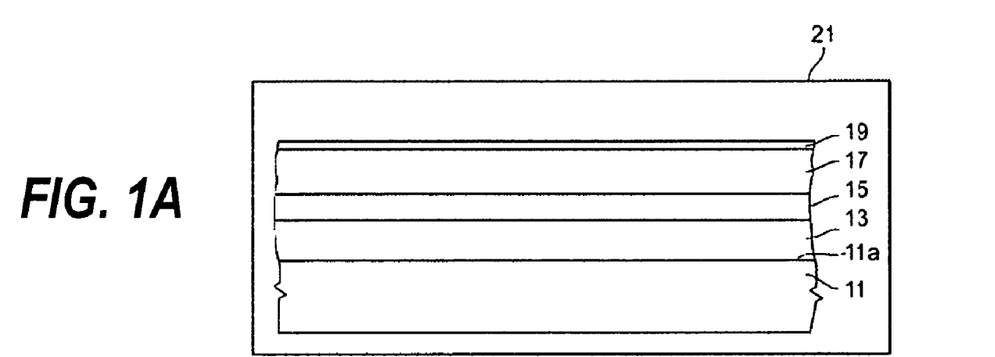
FIG. 1A shows a process for growing an epitaxial layer for the laser diode and FIG. 1B shows a process for preparing a mask for forming a mesa structure.
Figure 1B:
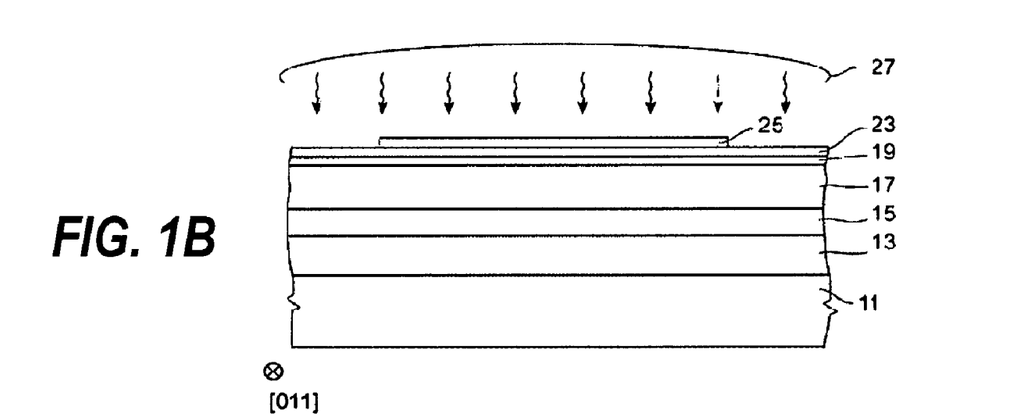

FIG. 1A shows a process for growing an epitaxial layer for a semiconductor laser diode, while, FIG. 1B shows a process for preparing a mask for forming a mesa structure.

First, a plurality of semiconductor layers for a semiconductor optical device is epitaxially grown on a primary surface 11a of a semiconductor substrate 11 made of a first III-V compound semiconductor material with a first conduction type. The primary surface 11a of the semiconductor substrate 11 maybe the (100) plane or its equivalent surfaces. Although embodiments described below epitaxially grows the semiconductor layers on the substantially (100) plane of the InP wafer, the invention is not restricted to those crystallographic surfaces and the growth can be carried out on a semiconductor surface tilt by ±0.1° from the (100) plane.

As shown in FIG. 1A, the present process epitaxially grows a lower cladding layer 13 made of a second III-V compound semiconductor material with the first conduction type, an active region 15, an upper cladding layer 17 made of a third III-V compound semiconductor material with a second conduction type, and a cap layer made of a fourth III-V compound semiconductor material. The growth of semiconductor layers can be carried out within a growing apparatus such as the Organo-Metallic Vapor Phase Epitaxy (OMVPE) furnace.

A typical condition of these layers is shown below:

TABLE I

Conditions of semiconductor layers

| Layer or Substrate | material | condition |
|---|---|---|
| Substrate 11 | n-type InP | [n]: $1 \times 10^{18}$ cm$^{-3}$ |
| Lower Cladding layer 13 | n-type InP | t: 0.55 μm |
| | | [n]: $8 \times 10^{17}$ cm$^{-3}$ |
| Active region 15 | GaAlInAs | t: 0.27 μm |
| Upper Cladding layer 17 | p-type InP | t: 0.44 μm |
| | | [p]: $8 \times 10^{17}$ cm$^{-3}$ |
| Cap layer 19 | p-type InGaAs | t: 0.20 μm |
| | | [p]: $2 \times 10^{17}$ cm$^{-3}$ |

The active region may be a single semiconductor layer, a single quantum well structure, or a multi-quantum well structure. The third III-V semiconductor layer 17 preferably includes an InP layer to effectively cause the mass-transportation in a subsequent process.

Figure 2A:
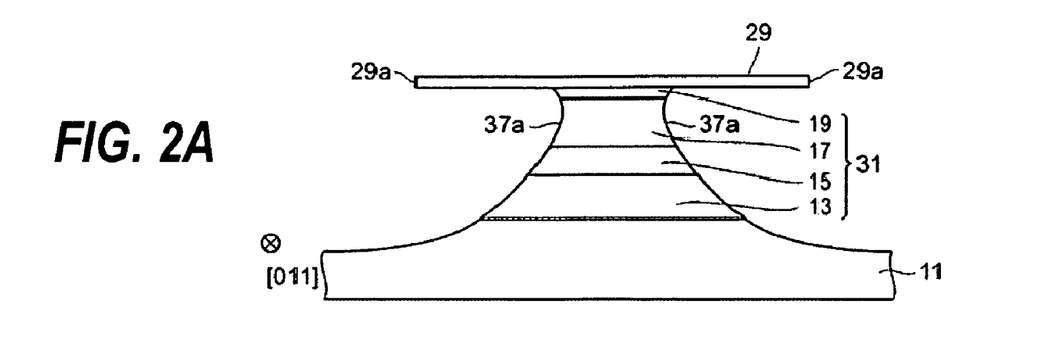
FIG. 2A shows a process for preparing a mask on the cap layer and FIG. 2B shows a process causing the mass-transportation.

FIG. 1B shows a process for preparing a mask on the cap layer 19. Subsequent to the growth of semiconductor layers, 13 to 19, the mask is formed on the cap layer 19. A silicon inorganic layer 23 such as silicon oxide (SiO$_2$) or silicon nitride (Si$_x$N$_y$) is pre-deposited on the cap layer 19 to form the mask. On the silicon inorganic layer 23 is coated with a photo resist 25 to form a pattern of the mask. The resist mask 25 is patterned by the exposure of the photo resist and the deposition of the exposed photo resist. As shown in FIG. 1B, the silicon inorganic layer 23 is etched by using the photo resist mask 25. Thus, an etching mask 29 made of the silicon inorganic material is prepared as shown in FIG. 2A.

The etching mask 29 provides an edge 29a along a [011] orientation. The semiconductor layers stacked below the etching mask 29, namely, the cap layer 19, the upper cladding layer 17 with the second conduction type, the active region 15, and the lower cladding layer 13 with the first conduction type, are wetly etched by using the mask 29 to form a mesa structure extending along the [011] orientation. Thus, the mesa structure 31 that shows an optical guiding function includes a cap layer 19, the upper cladding layer 17 with the second conduction type, the etched active region 15, and the lower cladding layer 13 with the first conduction type.

That is, the cap layer 19 is etched by the phosphoric acid first, in which only the cap layer 19 is selectively etched with respect to other layers, 13 to 17. Next, layers 13 to 17 with the cap layer 19 are etched by a methanol bromide as an etchant.

Both sides of the InGaAs cap layer 19 appears the (-11-1) and (-1-11) planes, respectively, that is, the InGaAs cap layer 19 appears a reverse mesa cross section, while, both sides of the active region 15 and layers below the active region 15 appears surfaces with crystal planes (11-1) and (1-11), namely, a normal mesa cross section. The side of the upper cladding layer 17 appears surfaces thereof varying from (-11-1) to (11-1) and (-1-11) to (1-11), respectively, and the width of the mesa structure becomes the narrowest at the mid of the upper cladding layer 17. The surface with the (111) or its equivalent planes shows a stable characteristic in the III-V compound semiconductor material, while, the other surfaces, such as the side of the upper cladding layer 17 in the present embodiment, are unstable such that, when the subsequent growth is performed on such an unstable surface, various defects may be induced to degrade the crystal quality. Therefore, it is quite effective to form the surface with the (011) plane in both sides of the upper cladding layer by the mass transportation.

Figure 2B:
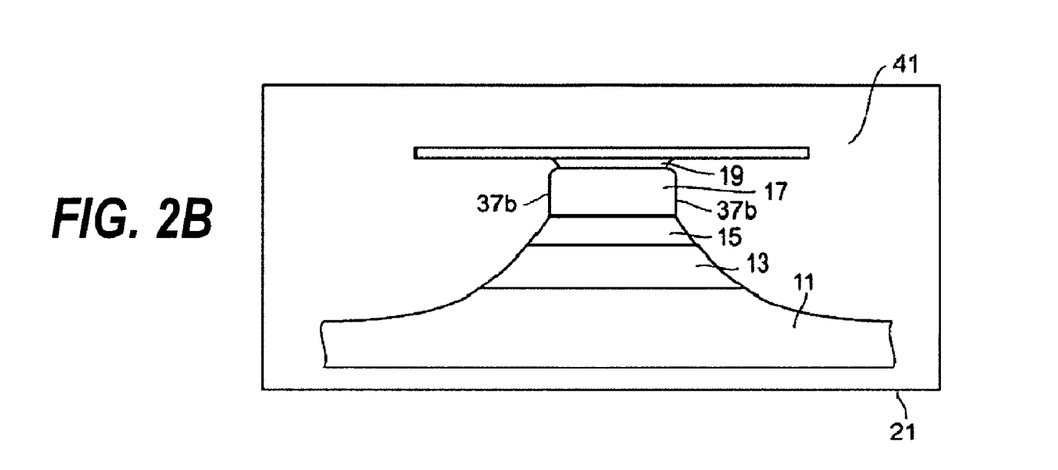

FIG. 2B shows a process where the mass-transportation occurs. Subsequent to the etching for forming the mesa structure, the mass transportation causes at a side 17a of the upper cladding layer 17, which is carried out within, for instance, a furnace of the OMVPE apparatus 21. In an embodiment shown below, the furnace is set under an atmosphere including phosphorous and/or phosphorous chemicals. The mesa structure 31 is thermally treated at the temperature T1 within the furnace, which is called as the thermal cleaning and occurs the mass transportation of InP to form both sides with a (01-1) and a (0-11) planes on at least a portion of the side surface of the upper cladding layer 17.

Moreover, since the atmosphere within the furnace contains the group V elements that are also contained in at least one of the first to fourth III-V semiconductor materials, the mass transportation can be carried out with suppressing the introduction of vacancies of the group V element by the dissociation thereof from the surface of the semiconductor materials. A temperature for the mass transportation may be greater than 570 ° C., which accelerates the growth of a mass transported semiconductor layer with the (01-1) and the (0-11) planes on both side of the upper cladding layer 17.

Following shows a condition for the thermal treatment to cause the mass transportation:

TABLE II

Conditions of thermal treatment

| Temperature T1 | 685° C. |
| Treatment Time | 20 minutes |
| Gas and its flow rate | PH$_3$ 100 sccm |

Preferable ranges of the treatment temperature, the treatment time, and the gas flow rate may be from 570 to 800° C., from 5 to 60 minutes, and from 20 to 500 sc cm, respectively. For sources to form the phosphoric atmosphere, organic materials, such as tertial-butyle-phosphine (TBP), may be also applicable. Moreover, the atmosphere 41 within the furnace may contain arsine, which is provided by, for instance, tertial-butyle-arsine (TBA).

Figure 3A:
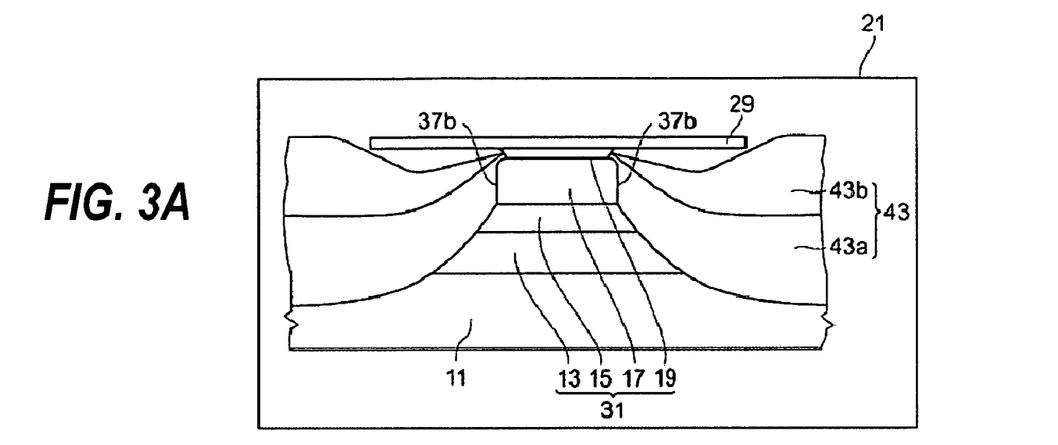
FIG. 3A shows a process for burying the mesa structure.

FIG. 3A shows a process for burying the mesa structure. Subsequent to the mass transportation, the burying regions 43 are selectively formed in both sides of the mesa structure 31 by using the left etching mask 29. The growth of the burying region 43 is performed by, for instance, the OMVPE apparatus. The burying region 43 includes a first current blocking layer 43a and a second current blocking layer 43b.

Typical conditions for the blocking layers, 43a and 43b, are shown below:

TABLE III

Conditions of the blocking layers

| Layer | material | condition |
| --- | --- | --- |
| First blocking layer 43a | p-type InP | t: 1.0 μm<br>[p]: $1.3 \times 10^{18}$ cm$^{-3}$ |
| Second blocking layer 43b | n-type InP | t: 1.0 μm<br>[n]: $2.0 \times 10^{18}$ cm$^{-3}$ |

The first blocking layer 43a may be a semi-insulating InP doped with iron (Fe). The burying region 43 is not deposited on the mask 29 made of silicon inorganic material, namely, the burying region 43 is deposited at temperature T2 only on the substrate 11 and the mesa structure 31 exposed by the etching process aforementioned. Accordingly, both sides of the mesa structure 31 are buried by the burying region 43.

Preferably, the process for burying the mesa structure 31 is carried out successively to the process for forming both sides 37b with the (01-1) and the (0-11) planes, respectively, of the upper cladding layer 17 by the mass transportation. By the successive process mentioned above, the surfaces of the semiconductor layers, 11 to 17, can be escaped from the contamination, which improves the crystal quality of the burying region on the semiconductor substrate, accordingly, enhances the performance of the semiconductor optical device thus manufactured and also enhances the reliability thereof. The OMVPE furnace makes it possible to successively perform two processes above mentioned.

The temperature T1 of the process for causing the mass transportation may be higher than the temperature T2 of the process for growing the burying region (T1>=T2) because this condition makes it effective to form the upper cladding layer 17 in both sides 37b thereof with the (01-1) and the (0-11) planes, respectively, and does not degrade the quality of the side thereof during the growth of the burying region 43. The present process forms both sides 37b with the (01-1) and the (0-11) planes, respectively, at a temperature T1=685° C. prior to the growth of the burying region 43, while the growth of the burying region is carried out at a temperature T2=655° C. Because both sides 37b with the (01-1) and the (0-11) planes, respectively, are thermally stable and clean, the burying region 43 shows a good homogeneity within the whole substrate.

Figure 3B:
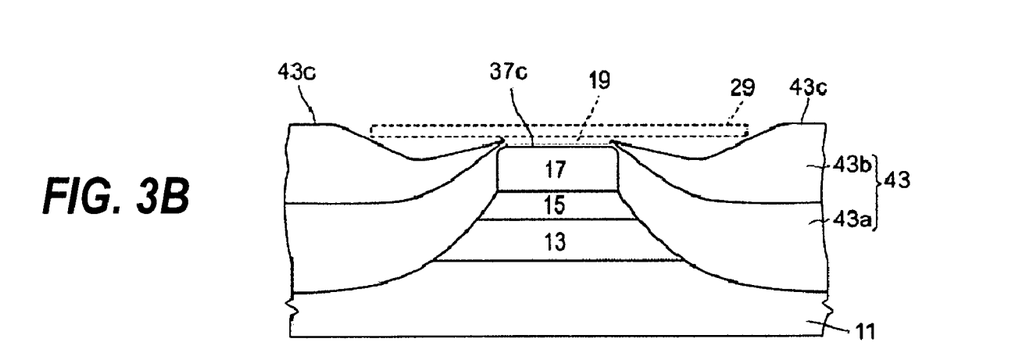
FIG. 3B shows a process for removing the mask and the cap layer.

FIG. 3B shows a process for removing the mask 29 and the cap layer 19. After the growth of the burying region 43, the mask 29 and the cap layer 19 are removed by, for instance, a hydrofluoric acid for the mask 29, while, the phosphoric acid is used for removing the cap layer 19. Thus, to remove the mask 29 and the cap layer 19 exposes the surface 43c of the burying region 43 and that 37c of the upper cladding layer 17.

Figure 4A:
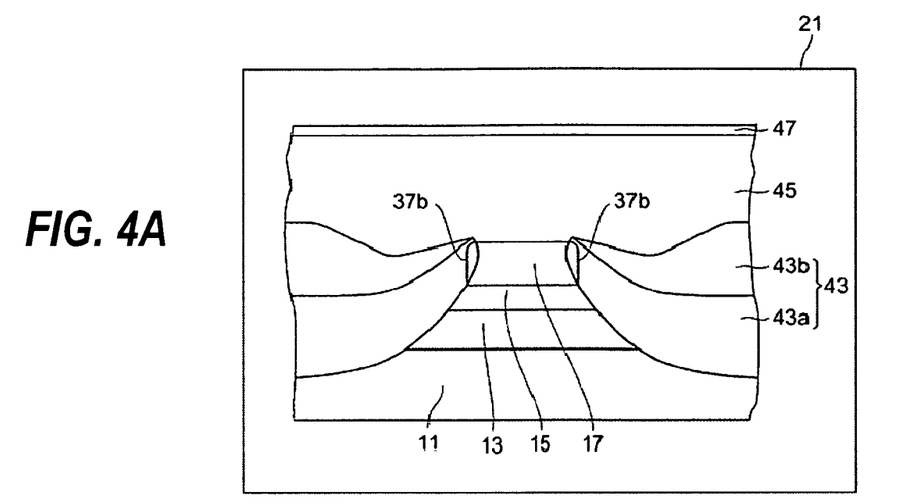
FIG. 4A shows a process for growing the second cladding layer with the second conduction type and the contact layer with the second conduction type.

FIG. 4A shows a process for growing a top cladding layer 45 and a contact layer 47, they have the second conduction type. After the removal of the mask 29 and the cap layer 19, the top cladding layer 45 made of III-V compound semiconductor material with the second conduction type is grown on the exposed surfaces, 43c and 37c, of the burying region 43 and that of the upper cladding layer 17.

Conditions of the top cladding layer 45 and the contact layer 47 are shown below:

TABLE IV

Typical Conditions of top cladding layer and the contact layer

| Layer | material | Conditions |
| --- | --- | --- |
| Second cladding layer 45 | p-type InP | t: 1.65 μm<br>[p]: $1.8 \times 10^{18}$ cm$^{-3}$ |
| Contact layer 47 | p-type InGaAs | t: 0.53 μm<br>[p]: $1.5 \times 10^{19}$ cm$^{-3}$ |

Figure 4B:
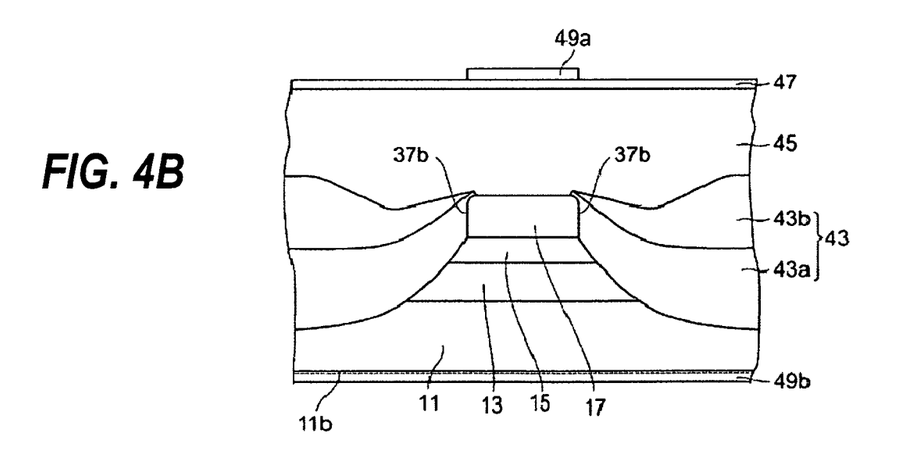
FIG. 4B shows a process for forming electrodes.

FIG. 4B shows a process for forming electrodes. Subsequent to the growth of the contact layer 47 with the second conduction type, a first electrode 49a with a striped configuration is formed on the contact layer 47 and a second electrode 49b is formed on the back surface 11b of the substrate 11. Both electrodes, 49a and 49b, show the ohmic characteristic. The first electrode 49a becomes an anode electrode, while, the second electrode 49b becomes a cathode electrode when the first conduction type is n-type.

Figure 5:
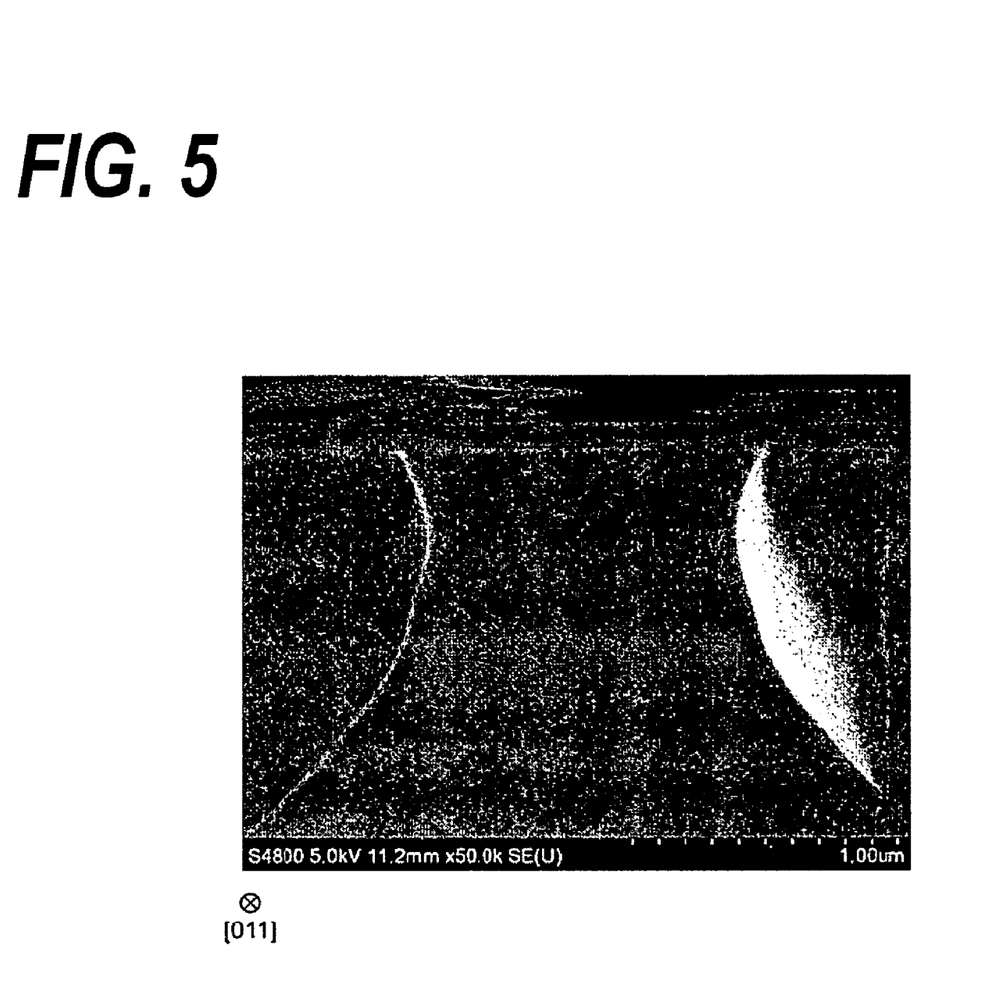
FIG. 5 is a photograph showing the cross section of the mesa structure after the etching of the semiconductor layers.

FIG. 5 is a photograph showing a cross section of the mesa structure 31 just after the second etching of semiconductor layers with the mask 29. As shown in this photograph, the etching forms the mesa structure with the reverse trapezoidal cross section in the upper portion thereof and the normal trapezoidal cross section in the lower portion. The mesa structure extends along the [011] direction.

Figure 6:
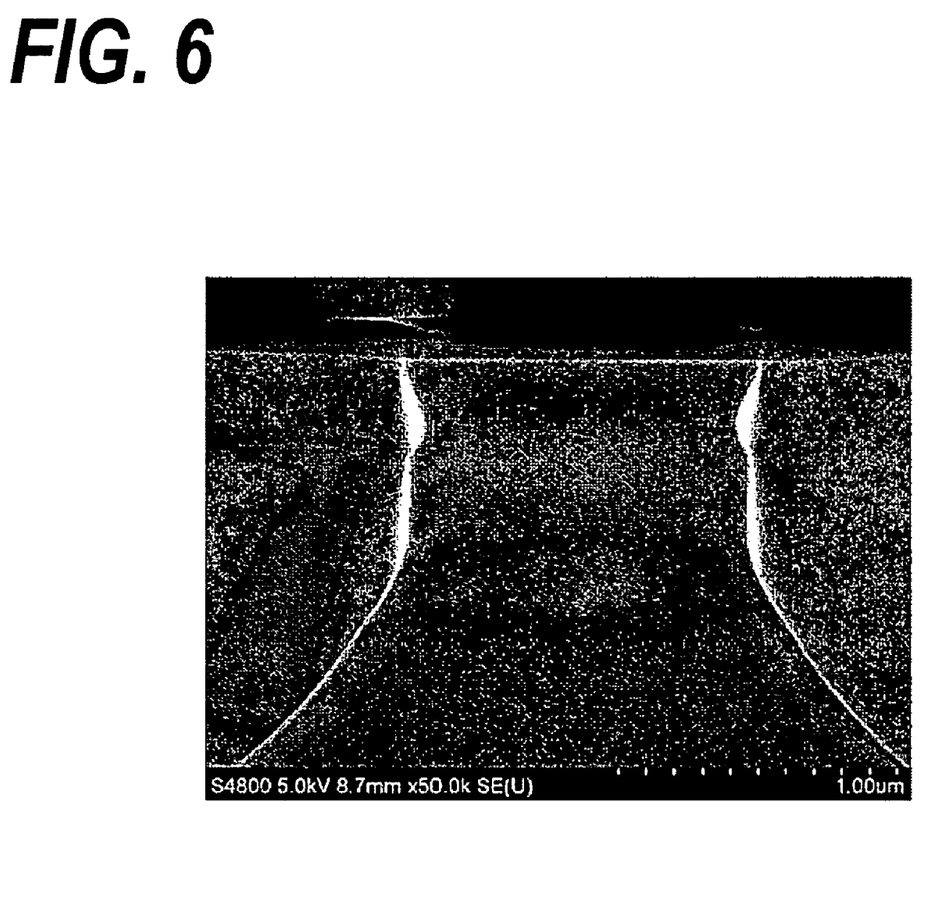
FIG. 6 is a photograph showing the cross section of the mesa structure after the thermal treatment to form both side surfaces with the (01-1) and the (0-11) planes of the upper cladding layer by causing the mass transportation.

FIG. 6 is a photograph showing the mesa structure after the thermal treatment within the atmosphere containing phosphine (PH$_3$). Comparing this photograph to that shown in FIG. 5, the side with the reverse trapezoidal cross section disappears and a portion of the side of the mesa structure expands in parallel to the surface of the semiconductor substrate, namely, in right and left directions in FIG. 6, which is due to the deposition of InP by the mass transportation.

Figure 7:
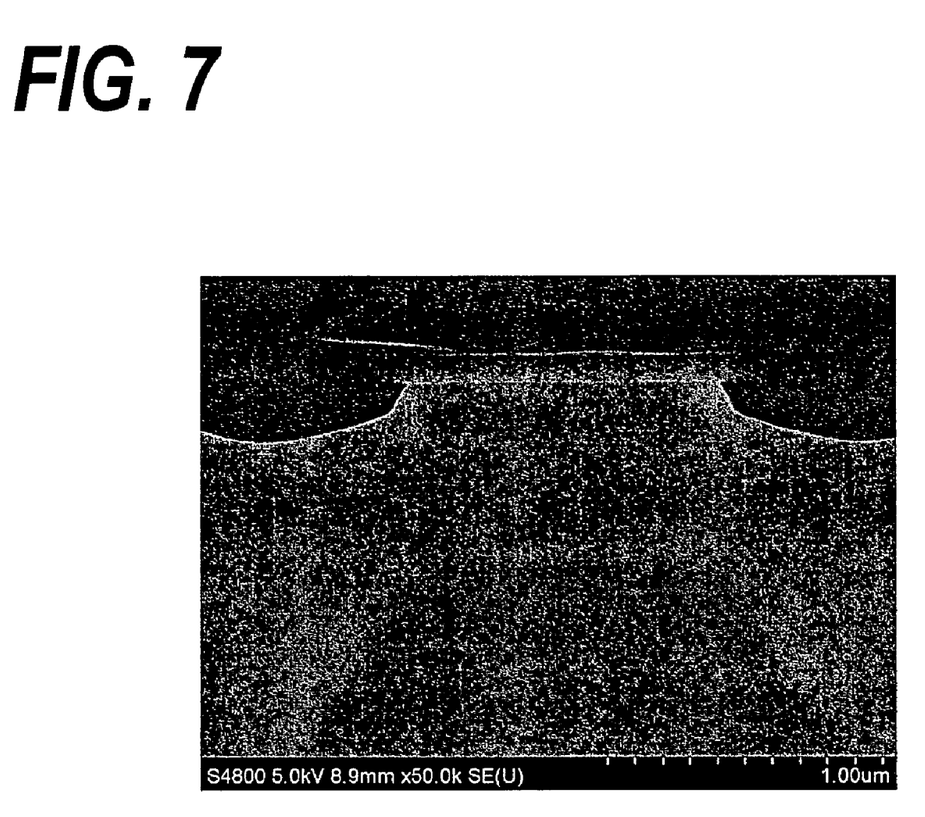
FIG. 7 is a photograph showing the mesa structure buried by the burying layers in both sides of the mesa structure.

FIG. 7 is a photograph showing the mesa structure after the process for burying the mesa structure. As shown in FIG. 7, the burying region grown in both sides of the mesa structure shows a good homogeneity in the whole layer.

Thus, the method according to the present invention forms the surfaces with the (01-1) and the (0-11) planes, respectively, in both sides of the upper cladding layer. These surfaces with the (01-1) and the (0-11) planes are clean and quite thermally stable, accordingly, the burying layer grown subsequent to the formation of this side surface shows a good homogeneous burying region. Therefore, the present invention may provide a process that may reduce the in-homogeneity of the burying region.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art. For instance, although the description defines the surface with the specific plane such as (01-1) and (0-11) planes, the invention may be carried out for those surfaces equivalent to the (01-1) and the (0-11) planes.

What is claimed is:

1. A method for producing a semiconductor optical device, comprising steps of:

growing a series of semiconductor layers on a primary surface with (100) surface orientation of a first III-V compound semiconductor substrate with a first conduction type, the semiconductor layers including a lower cladding layer made of a second III-V compound semiconductor material with the first conduction type, an active region, an upper cladding layer made of a third III-V compound semiconductor material with a second conduction type, and a cap layer made of a fourth III-V compound semiconductor material;

forming a mask on the cap layer, the mask extending along [011] orientation;

selectively etching the cap layer with respect to the upper cladding layer such that both sides of the cap layer show (−11-1) and (−1-11)crystal planes, respectively;

selectively etching the upper cladding layer, the active region, the lower cladding layer and a portion of the semiconductor substrate with respect to the cap layer to form a mesa structure such that a side of the lower cladding layer and the portion of the semiconductor substrate show planes with (11-1) and (1-11) planes, respectively, and both sides of the upper cladding layer showing planes varying from (−11-1) to (11-1) and (−1-11) to (1-11), respectively;

thermally treating the mesa structure at a first temperature in an atmosphere including group V elements to form both side surfaces of the upper cladding layer with (01-1) and the (0-11) planes, respectively, by causing a mass transportation; and growing a burying region at a second temperature in both sides of the mesa structure to bury the mesa structure.

2. The method according to claim 1,
wherein the first temperature is higher than the second temperature.

3. The method according to claim 2,
wherein the first temperature is between 570° C. and 800° C.

4. The method according to claim 1,
wherein the step for thermally treating the mesa structure and the step for growing the burying region are successively carried out within a growing furnace.

5. The method according to claim 1,
wherein the cap layer is made of InGaAs and
wherein the step for selectively etching the cap layer is carried out by a phosphoric acid.

6. The method according to claim 5,
wherein the step for selectively etching the upper cladding layer, the active region, the lower cladding layer, and the portion of the substrate is carried out by methanol bromide.

7. The method according to claim 1,
wherein the step for growing the burying region includes a step for sequentially growing a first current-blocking layer and a second current-blocking layer.

8. The method according to claim 1,
further comprising a step for growing a second cladding layer with the second conduction type and a contact layer with the second conduction type on the mesa structure and the burying region.

9. The method according to claim 1,
wherein the selectively etching of the upper cladding layer, the active region, the lower cladding layer, and the substrate is carried out such that a width of the upper cladding layer becomes narrowest in a mid region of the upper cladding layer.

10. The method according to claim 1,
wherein the thermal treatment is carried out within the atmosphere containing phosphorous or arsenic.

11. A method for manufacturing a semiconductor laser diode, comprising steps of:

growing an InP lower cladding layer, an active region, an InP upper cladding layer, and a InGaAs cap layer sequentially on an InP substrate;

etching the InGaAs cap layer selectively with respect to the InP upper cladding layer, the active region, the InP lower cladding layer, and the InP substrate such that a side of the InGaAs cap layer appears as a surface with a(−1-11) crystal plane;

etching the InGaAs cap layer, the InP upper cladding layer, the active region, the InP lower cladding layer, and the InP substrate to form a mesa structure such that a side of the active region, a side of the InP lower cladding layer, and a portion of the substrate appear as a (11-1) plane, and a side of the InP upper cladding layer appears as surfaces varying from a (−11-1) plane near the InGaAs cap layer to a (11-1) plane near the active region;

thermally treating the mesa structure at a first temperature within an atmosphere containing phosphorus to form a side with a (0-11) plane in the InP upper cladding layer; and burying the mesa structure by growing first and second current blocking layers at a second temperature below the first temperature.

* * * * *